US006260998B1

(12) United States Patent
Garfinkel et al.

(10) Patent No.: US 6,260,998 B1
(45) Date of Patent: Jul. 17, 2001

(54) METHOD FOR SPECIFYING ACCELERATED THERMAL CYCLING TESTS FOR ELECTRONIC SOLDER JOINT DURABILITY

(75) Inventors: George Albert Garfinkel, Westland; James M. Hu, Plymouth; Jacob Frimenko, Northville; Robert Charles Harris, Farmington Hills; Robert Emmett Murray, Livonia; John Bengt Abrahamsson, Sterling Heights, all of MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/487,365

(22) Filed: Jan. 19, 2000

(51) Int. Cl.[7] .................................................. G01N 25/72
(52) U.S. Cl. ................................ 374/57; 374/47; 374/5; 324/760
(58) Field of Search ..................... 324/760, 441, 324/224, 507, 757, 525, 573; 374/45, 57, 4, 5, 6, 7

(56) References Cited

U.S. PATENT DOCUMENTS 5,032,727 * 7/1991 Cox et al. ............................ 250/330
5,047,713 * 9/1991 Kirino et al. ........................ 324/752
5,228,776 * 7/1993 Smith et al. ............................ 374/5
5,744,975 * 4/1998 Notohardjono et al. ............. 324/760
5,767,406     6/1998 Hu .

* cited by examiner

Primary Examiner—Safet Metjahic
Assistant Examiner—Vincent Q. Nguyen
(74) Attorney, Agent, or Firm—Mark L. Mollon

(57) ABSTRACT

A method for testing an electronic module to evaluate solder joint failures caused by thermally induced stress includes determining a thermal shock endurance test profile that represents field temperature conditions, estimating time/cycles to failure of solder joints in the module using numerical simulation techniques, selecting a design life duration for the module, comparing the design life duration of the module with the estimated time/cycles to failure of the weakest solder joint in the module, determining between robust, marginal, and non-robust module designs based on the design life duration of the module and the estimated time/cycles to failure of the at least one solder joint in the module, and determining an accelerated thermal shock endurance test specification having a test duration for testing the electronic module upon determining a marginal module design. The test duration and sample size requirements of the accelerated thermal shock endurance test are determined as a function of the field temperature conditions, the design life target, and the product reliability target of the module.

12 Claims, 3 Drawing Sheets

METHOD FOR SPECIFYING ACCELERATED THERMAL CYCLING TESTS FOR ELECTRONIC SOLDER JOINT DURABILITY

TECHNICAL FIELD

The present invention generally relates to thermal cycle/shock tests for evaluating the resistance of an electronic product to thermally induced stress and, more particularly, to a method for determining a thermal cycle/shock test profile having testing times for testing the resistance of an electronic product to thermally induced stress and for assessing the reliability of the electronic product under such stress.

BACKGROUND ART

The creep/fatigue of solder joints caused by the thermal expansion mismatch between components and a printed wiring board (PWB) is a major concern for electronic products under severe thermal environments. Currently, the reliability of the solder joints in electronic products is validated by thermal cycle/shock tests to a specified number of cycles. Product design engineers ask if a test specification is adequate to meet the reliability requirements. The task has been investigated using various methods and one of them is a simple closed-form solution to model solder creep/fatigue. However, these closed-form solutions are not sophisticated enough to accommodate the effect of time dependent creep behavior on thermal strain in solder joints.

Thermal fatigue crack initiation and propagation in solder joints is a potential failure mechanism that may induce durability problems in electronic products. For commonly used Pb/Sn eutectic solder the field operational temperatures could be as high as 75% of the alloy melting temperature. The operational temperature induces a significant amount of creep coupled with fatigue during temperature/power cycles. This is especially true for surface mount technology where the thermal-mechanical stresses/strains imposed on the solder joints are significantly larger than those in the plated-through-hole technology. It is believed that the low cycle fatigue life of solder joints is directly related to the maximum strain ranges or strain energy density in the solder joint. However, to account for the effects of temperature holding times, ramp rates, etc., the strain range and strain energy density used in the model should be determined from the stress-strain hysteresis loop during time dependent creep.

In general, the stress-strain hysteresis loop in a solder joint depends on (i) the difference in the coefficient of thermal expansion (CTE) between components and the PWB; (ii) temperature profiles including cycling range, ramp rate, and dwell time; (iii) size of the components and stiffness of the PWB; (iv) solder joint material properties (time and temperature dependent); and (v) solder joint geometry including type (such as leadless joint, gull-wing leaded joint, etc.), stand off height, fillet shape, inter metallic thickness, etc. All these factors also affect the maximum strain ranges that determine the life of the joints.

To calculate the time dependent strain range and strain energy density of solder joints, numerical simulation methods such as finite element analysis are used. These analysis techniques handle three types of solder joints: (i) leadless joints for chip capacitors, chip resistors, chip carriers, and flip chip bumps; (ii) leaded joints for gull-wing, J-leads, and butt leads; and (iii) interlayer joints for multi-layer stacks. The failure criteria for these joints can be developed and implemented for crack initiation life prediction.

The failure criterion for leadless joints is based on the total strain range determined by the temperature cycle profiles and solder elastic-viscoplastic properties. The approach to determine creep strain has been proposed through solving the following equations:

$$\frac{d\gamma}{dt} + \frac{1}{k}\frac{d\tau}{dt} = 0 \tag{1}$$

$$\frac{d\gamma_{CRP}}{dt} = B\tau^n \tag{2}$$

$$\Delta\gamma + \frac{\Delta\tau}{k} = \frac{L}{h}\Delta\alpha\Delta T \tag{3}$$

$$\frac{d\gamma}{dt} - \frac{d\gamma_{CRP}}{dt} = \frac{1}{G}\frac{d\tau}{dt} + \frac{\tau}{G^2}\frac{dG}{dt} \tag{4}$$

where L is the distance from solder joint to the middle of the component, h is the solder joint stand-off, $\Delta\alpha$ is the CTE difference of the component and the PWB/substrate, $\Delta T$ is the range of temperature cycles, $\tau$ and $\gamma$ are the nominal shear stress and strain, G is the shear modulus, k is the stiffness constant depending on the materials and configurations of the component/substrate, and B and n are creep properties of the solder material.

For leaded components, the thermal stress range can be calculated by combining the shear and normal stresses. The leads are treated as simple beams, and solder joints are modeled as a temperature dependent elastic-plastic material. The time dependent effect is only considered through a frequency dependent parameter in the constitutive equation. The equivalent strain is determined in the joint along the lead foot length, and the local maximum value near the heel is used for fatigue life prediction.

For both cases, the fatigue life prediction is based on the Coffin-Manson relation:

$$N_i = C[\Delta\gamma_i]^{-m} \tag{5}$$

where the constants C and m are material dependent fatigue coefficients and N is the number of cycles to failure. In the field operation, the temperature applied to a solder joint is not within a constant range. Thus, if $n_i$ represents the stress cycles applied to a product, the fatigue life and the total cumulative damage D is estimated by Miner's rule as follows:

$$D = \sum \frac{n_i}{N_i} = \sum \frac{n_i}{C}\Delta\gamma^m \tag{6}$$

Equation 6 is used to determine the fatigue life of solder joints based on the physics-of-failure approach and the estimation of the damage D.

In the automotive industry, product reliability is validated by a series of tests. Among them, accelerated thermal cycle/shock tests are used to check the integrity of solder joints and to validate product reliability. A typical test profile consists of one hour cycles with 15 to 25 minutes holding time at two temperature extremes. Thermal cycle/shock tests are conducted for a specified cycle duration (500 to 2000 cycles, i.e., 20 to 80 days).

A problem with typical thermal cycle/shock tests is that the number of cycles of the specified cycle duration does not correlate to the expected number of years of field operation for the product given a specified field temperature profile.

Consequently, the number of cycles in the specified cycle duration is conservatively high resulting in wasted testing time and/or over designed products.

What is needed is a method for determining a thermal cycle/shock test profile tailored to an electronic product in which the resistance of the electronic product to thermally induced stress is to be tested. The advantage of having a test profile tailored to the electronic product to be tested is that the testing times of the test profile may be less than the specified cycle duration of typical thermal cycle/shock tests and the resulting profile represents the field operation environment more accurately than a generic specification.

DISCLOSURE OF INVENTION

Accordingly, it is an object of the present invention to provide a method for determining an accelerated thermal cycle/shock test profile having testing times for testing the resistance of an electronic product to thermally induced stress and for assessing the reliability of the product under such stress.

In accordance with the above object and other objects, the present invention provides a method for testing an electronic module to evaluate solder joint failures caused by thermally induced stress. The method includes determining a thermal shock endurance test profile that represents field temperature conditions. The time to failure of solder joints in the electronic module using numerical simulation techniques is then estimated. A design life duration for the electronic module is then selected. The design life duration of the electronic module is then compared with the estimated time to failure of the weakest solder joint, i.e., the solder joint with the estimated shortest time to failure, in the electronic module. Robust, marginal, and non-robust electronic module designs is then determined based on the design life duration of the electronic module and the estimated time to failure of the weakest solder joint in the electronic module. An accelerated thermal shock endurance test specification having a test duration for testing a marginal electronic module design is then determined. The test duration of the accelerated thermal shock endurance test is determined as a function of the field temperature conditions and the design life duration of the electronic module.

BRIEF DESCRIPTION OF DRAWINGS

The present invention will now be described in further detail, and by way of example, with reference to the accompanying drawings, in which.

BEST MODE FOR CARRYING OUT THE INVENTION

Figure 1:
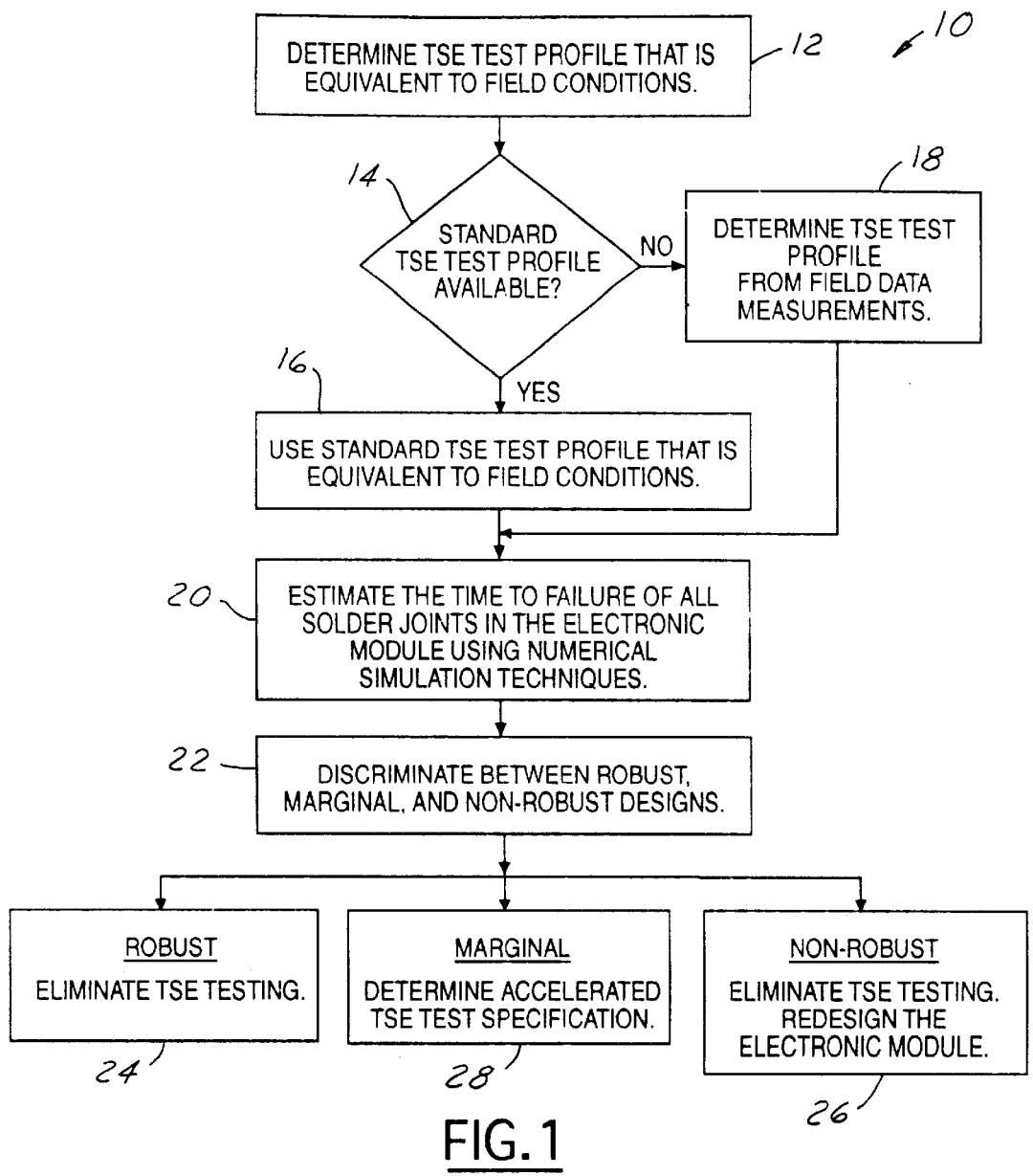
FIG. 1 illustrates a flowchart describing operation of the method of the present invention.

Referring now to FIG. 1, a flowchart 10 illustrating operation of the method of the present invention is shown. The method of the present invention is an evaluation and screening scheme using thermal cycling tests also known as a thermal shock endurance (TSE) tests, as well as numerical simulation and analysis, for verifying that an electronic module is free from solder joint failures caused by thermally induced stress. The thermally induced stress can occur during the intended useful life of the electronic module.

The method of the present invention accesses resistance of an electronic module to fatigue failures, particularly, solder fatigue cracking. The method of the present invention provides a step-by-step approach for the evaluation of an electronic module containing solder joints. The method of the present invention uses numerical simulation techniques to screen electronic module designs for fatigue failures.

The method of the present invention uses a physics-of-failure approach to analyze an electronic module with a given TSE test profile and based on equivalent damage and specific application stresses of the electronic module, determines a customized TSE test profile for the electronic module. The customized TSE test profile is based on existing generic test specifications and/or field measurements, customer usage profiles, and the desired product life goal. These factors determine the nominal testing duration based on the equivalent damage generated from worst-case field applications. The customized TSE test profile has optimized testing times and/or temperature ranges for testing an electronic module enabling significant savings in testing resources and equipment over current practices.

The method of the present invention begins with box 12 determining the TSE test profile that is equivalent to field conditions. A typical TSE test profile consists of one hour cycles with 15 to 25 minutes of holding time at two temperature extremes. The temperature range for the TSE test profile varies from a low level to a high level depending on the environment surrounding the electronics module. For instance, in the automotive industry, an electronic product mounted in the passenger/luggage compartment could be tested from −40° C. to 100° C.; a product mounted in the engine compartment could be tested from −40° C. to 125° C.; and a product mounted directly on the engine could be tested from −40° C. to 150° C.

Box 14 then determines if a standard (generic) TSE test profile that is equivalent to the field conditions is available. An example of a standard TSE test profile is a customer standard which contains several generic temperature classification zones depending upon component location in a vehicle. Each zone has an associated TSE test profile with fixed test times and number of cycles. Box 16 then uses the standard TSE test profile if one is available.

If a standard TSE test profile is not available, or is not desired to be used, then box 18 determines a TSE test profile from field temperature data measurements, i.e., field temperature profiles.

A field temperature profile is the typical time history of temperatures observed in an electronic product. The field temperature profile describes the thermal environment around solder joints as a function of time. The major parameters of a temperature profile include temperature peaks, temperature valleys, equivalent temperature ranges, mean temperatures, daily number of cycles, and dwell time (or frequency). The temperature profile of an electronic product results from thermal environment and electronics usage conditions such as how many times a day and for how long the electronics module is operated.

The effects of electronics usage and heat dissipation from engine and powered electronic components on the temperature profile vary significantly in different module locations. For example, in the automotive industry, vehicle mounting locations are classified into engine mounted, engine compartment, chassis mounted, open instrument panel, closed instrument panel, and trunk. In this analysis, for simplicity, the vehicle mounting locations are classified into: (i) engine mounted (EM), (ii) engine compartment (EC), and (iii) passenger/luggage compartment (PL).

According to this method, the daily maximum temperature, $T_{max}$, and daily minimum temperature, $T_{min}$, are collected in statistical weather reports from various climatological stations. The reported temperature data are averaged monthly or weekly. To include the effect of sun exposure on temperature peaks, the maximum sun-exposed temperature data measured under extreme conditions are extrapolated to other conditions during the year based on the assumption that the effect of sun exposure is proportional to the maximum daily temperature for each month. To include the effect of vehicle operation on the temperature peaks in various vehicle compartments, the maximum temperature under extreme vehicle operation conditions in the hot portion of summer (August) is extrapolated to other conditions during the year.

Typical daily temperature profiles are affected by how a driver operates the vehicle. In this analysis, it is assumed that (i) temperature in a vehicle changes gradually following a sinusoidal shape; (ii) vehicles are usually operated twice a day from 7:30 a.m. to 9:00 a.m. and from 4:30 p.m. to 6:00 p.m.; (iii) vehicles are usually operated within an identical geographical (climatic) region; and (iv) the shapes of field-measured temperature profiles in PL, EC, and EM are similar for most vehicles.

Based on the daily temperature profiles, the typical thermal strain spectrum can be established for fatigue damage and reliability estimation.

Figure 4:
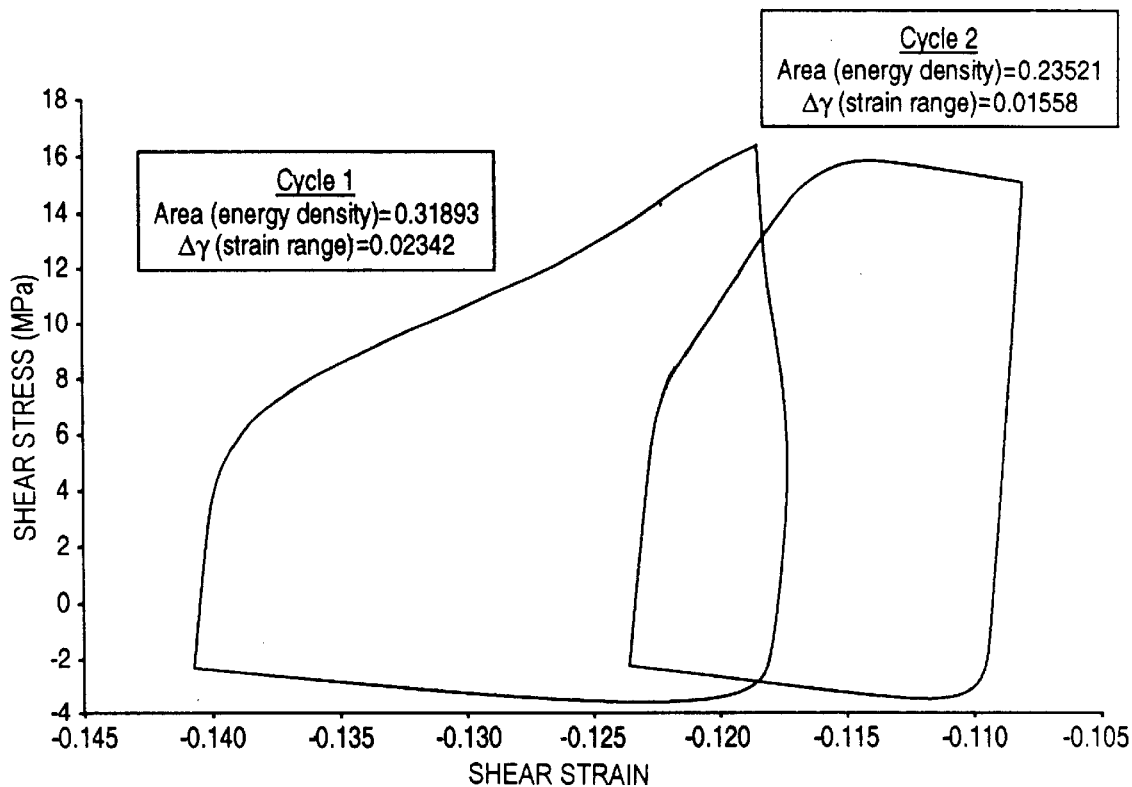
FIG. 4 illustrates stress-strain hysteresis loops used for estimating the time to failure of the solder joints in accordance with the method of the present invention.

After a TSE test profile is chosen, box 20 then estimates the time to failure of all of the solder joints of the electronic module using numerical simulation techniques such as finite element analysis. Box 20 may also estimate the time to failure of the solder joints using numerical simulation techniques based on plastic strain range. Box 22 may further estimate the time to failure of the solder joints using numerical simulation techniques based on energy density calculated from stress-strain hysteresis loops such as those shown in FIG. 4. Based on the estimated time to failure, box 22 discriminates the electronic module based on the estimated failure time of the solder joints between robust, marginal, and non-robust designs.

A robust solder joint design has a time to solder joint failure greater than a predetermined TSE test time threshold. The predetermined TSE test threshold is the time to solder joint failure that incorporates a design safety factor beyond a product minimum requirement. An electronic module is determined to be robust when all solder joints have an estimated time to failure greater than the TSE test threshold time level. In response to box 22 determining the electronic module to be robust, box 24 eliminates TSE testing, i.e., eliminates thermal cycle/shock tests completely.

A non-robust solder joint design has a time to solder joint failure less than a minimum product requirement failure time. An electronic module is determined to be non-robust when the weakest solder joint has an estimated time to failure shorter than the minimum product failure time requirement. In response to box 22 determining the electronic module to be non-robust, box 26 eliminates TSE testing because the electronic module design is defective. Box 26 then advises that the module should be redesigned.

A marginal solder joint design has a time to solder joint failure greater than the minimum product failure time requirement but less than the TSE test time threshold. In response to box 22 determining the electronic module to be marginal, box 28 determines an accelerated TSE test specification, i.e., thermal cycle/shock test profile, having a testing duration and testing temperatures.

A typical value for an initial TSE test time threshold may be 1.5 times the product minimum requirement. This value may be reduced as experience is gained and estimated failure times are more accurately calculated, thus reducing further the need for testing, as the number of marginal designs will decrease accordingly.

As described above, accelerated thermal cycle/shock tests check the integrity of solder joints. The temperature range for this test varies from a lowest level to a highest level depending on the electronic module location. A typical temperature profile consists of one hour cycles with 15 to 25 minutes holding time at the two temperature extremes.

Box 28 determines the accelerated TSE test specification, i.e., customized TSE test specification, having a given number of cycles, i.e., the test duration, that should be conducted. Box 28 also determines a test temperature profile for the accelerated TSE test specification. The test duration correlates to the expected number of years of field operation given a specified field temperature profile. Box 28 determines the test duration by using the physics of failure approach and solves the time duration problem by using a damage equivalence technique.

To do this, box 28 equates the estimated damage induced in the test and the estimated damage induced in the field operation as follows:

$$D_T(\text{Test profile, Test duration}) = D_F(\text{FTP, Design Life}) \qquad (7)$$

where $D_T$ is the total damage in solder joints during the test and $D_F$ is the total damage induced during field operation for a desired operating time period. In the above equation, the test profile is specified, FTP is the field temperature profile as discussed, the design life is also specified (e.g., three years), and the test duration is an unknown to be determined.

The customized TSE test specification is designed to reduce the overall testing time by using a shorter and more severe temperature cycle (with elevated high temperatures), or to test using different high and low temperatures than those prescribed by the generic specification selected in box 12. This may prove useful to reduce overall testing times, in cases of testing electronic module limitations, and when trying to apply the same temperature profile to two electronic modules belonging to different temperature classification zones.

Figure 2:
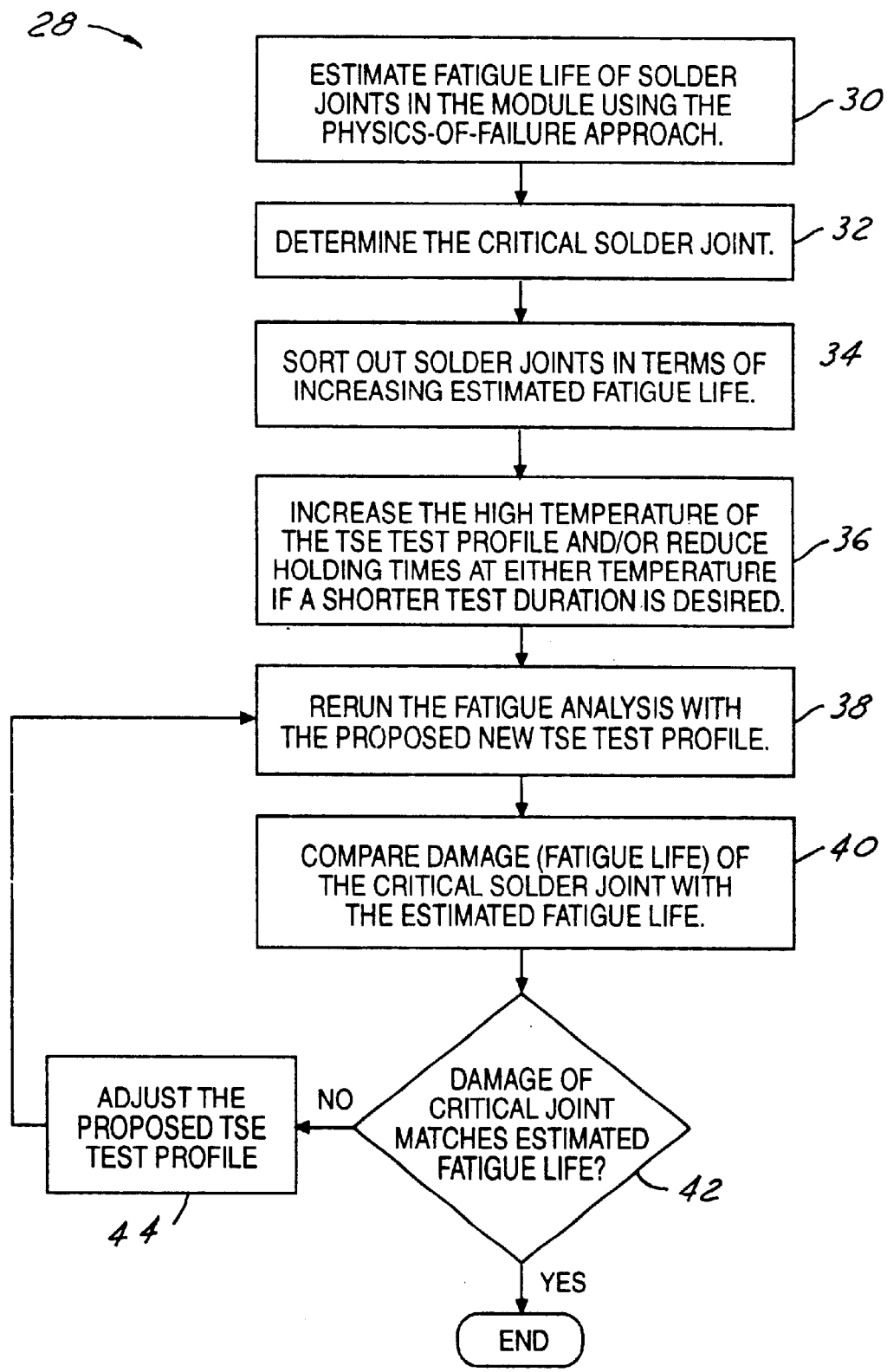
FIG. 2 illustrates a flowchart describing operation for determining an accelerated thermal shock endurance (TSE) test profile in accordance with the method of the present invention.

Referring now to FIG. 2, box 28 for determining the accelerated TSE test specification will now be described in further detail. Initially, box 30 estimates the fatigue life of solder joints in the electronic module using the physics-of-failure approach. Box 32 then determines the critical solder joint, i.e., the solder joint which is estimated to have the shortest fatigue life. Box 34 then sorts out solder joints in terms of increasing fatigue life. Box 36 then increases the high temperature of the TSE test profile and/or reduces holding times of the low or high temperature if a shorter test duration is desired. Box 38 then reruns the fatigue analysis with the proposed new TSE test profile. Box 40 then compares the damage (fatigue life) of the critical solder joint with the estimated fatigue life. Box 42 then determines if the damage of the critical joint matches the estimated fatigue life. If not, box 44 adjusts the proposed new TSE test profile and then box 38 reruns the fatigue analysis with the adjusted proposed new TSE test profile. The process is continued until box 42 determines that the damage of the critical joint matches the estimated fatigue life.

An example of actual experiments conducted by the inventors applying the method of the present invention to an automotive electronics module will now be described. The component types selected are: a 2512 chip resistor, a 1206 chip resistor, a 160 lead Quad flat pack (160L-QFP), and a 28 lead small-outline integrated circuit (28L-SOIC). The chip resistors have leadless interconnects, while the other components have gull wing leads.

Figure 3:
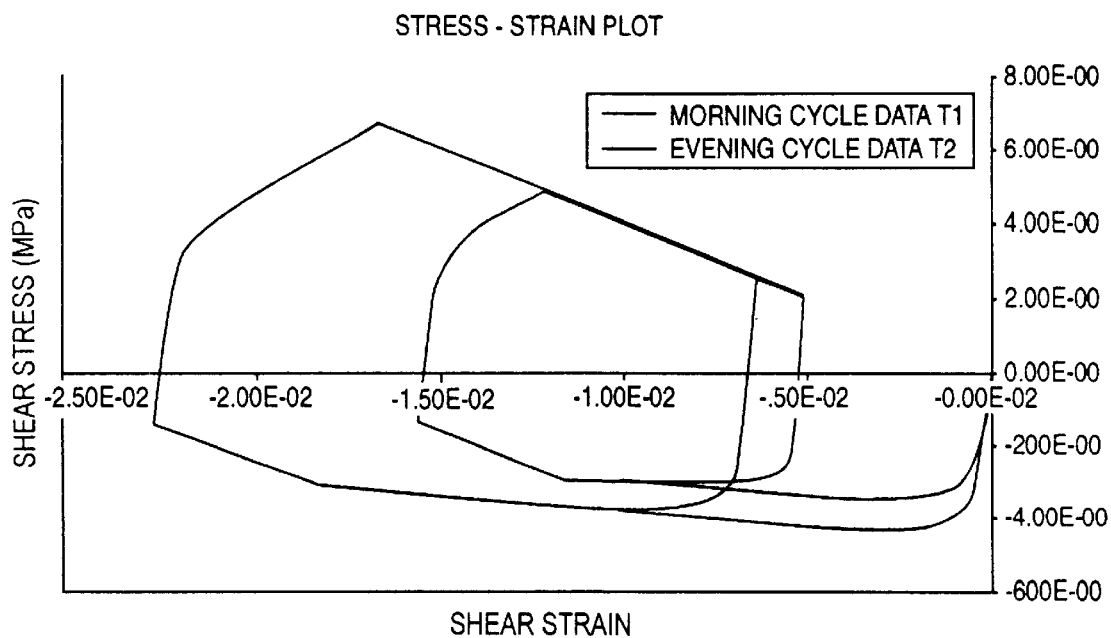
FIG. 3 illustrates an example of two stress-strain loops for a leadless solder joint under $\Delta T1$ and $\Delta T2$ cycles.

The number of cycles to crack initiation for the solder joints in the four components for EM, EC, and PL locations within the vehicle is initially estimated. For each location and using the monthly temperature profiles described above, the number of cycles to crack initiation can be calculated for each component. An example of these results is shown in Table 1 for a 1206 leadless chip resistor in the PL compartment. In Table 1, $\Delta T1$ and $\Delta T2$ represent the morning and evening temperature cycles described above. An example of two stress-strain loops for a leadless solder joint under $\Delta T1$ and $\Delta T2$ cycles is shown in FIG. 3.

The number of cycles to crack initiation for a given $\Delta T$ with specified dwell and ramp times is then estimated. The damage per year for each column in Table 1 is calculated based on the following equation:

$$D_F\big|_{YEAR} = \frac{31}{N_{Jan}} + \frac{28}{N_{Feb}} + \frac{31}{N_{Mar}} + \frac{30}{N_{Apr}} + \ldots + \frac{31}{N_{Dec}} = \sum_{1}^{12} \frac{days}{N}\bigg|_{Month} \quad (8)$$

where N is the number of cycles to crack initiation. The total damage per year in Table 1 is obtained by adding the yearly damages caused by $\Delta T1$ and $\Delta T2$.

TABLE 1

1206 Chip Resistor. Field damage for PL location in cycles to crack initiation.

| Month | $\Delta T1$ | $\Delta T2$ |
|---|---|---|
| January | 68270 | 205800 |
| February | 41430 | 110700 |
| March | 25770 | 36000 |
| April | 10690 | 25380 |
| May | 6743 | 14290 |
| June | 3849 | 7356 |
| July | 3637 | 5867 |
| August | 4353 | 6829 |
| September | 4957 | 8746 |
| October | 8002 | 17850 |
| November | 28750 | 78750 |
| December | 87430 | 178300 |
| Damage/Year | 0.0445 | 0.0242 |
| Total Damage/Year | 0.0687 | |

The number of cycles to crack initiation using accelerated test profiles with one hour cycles (holding times of 25 minutes and ramp time of 5 minutes) is then calculated. According to Equation 8 the cumulative damage in the test could be written as:

$$D_T = \frac{N_{test}}{N_{CI}} \quad (9)$$

where $D_T$ is the total damage generated in the test, Ntest is the number of thermal cycles applied to the products, and $N_{CI}$ is the number of accelerated cycles to crack initiation as calculated. Therefore, the number of accelerated cycles required to generate the same damage as in the field application can be obtained as follows according to Equation 7:

$$N_{eq\text{-}test} = N_{test} = LD_{F|Year}N_{CI} \quad (10)$$

where $N_{eq\text{-}test}$ is the required test duration correlating to the field application, and L is the desired design life of the products. Assuming L=10 years, the equivalent test duration for 2512 chip resistor, 1206 chip resistor, 160L-QFP, and 28L-SOIC at each vehicle mounting location was calculated. Table 2 summarizes the results for all four components and the three vehicle locations. These results reflect the equivalent fatigue damage for crack initiation. For example, for a 160L-QFP in a PL compartment, if no solder joint crack appears after 210 thermal cycles at the stated temperature profiles, the crack will not be initiated in the solder joint during ten years of worst case environment.

TABLE 2

No. of accelerated test cycles to match 10-year field damage at different vehicle locations.

| Location | Component | $N_{eq\text{-}test}$ |
|---|---|---|
| EM: Engine Mount | 2512 Res. | 6180 |
| | 1206 Res. | 6280 |
| | 160L-QFP | 1370 |
| | 28L-SOIC | 1310 |
| EC: Engine Compartment | 2512 Res. | 4480 |
| | 1206 Res. | 4480 |
| | 160L-QFP | 530 |
| | 28L-SOIC | 560 |
| PL: Passenger/Luggage Compartment | 2512 Res. | 1650 |
| | 1206 Res. | 1490 |
| | 160L-QFP | 210 |
| | 28L-SOIC | 250 |

From the calculated results, it can be concluded that leadless solder joints should have more severe test duration requirements than those for leaded solder joints. However, the test duration requirements are not very sensitive to the component size and geometry if the solder joint types are not the same.

The testing requirement determined based on a damage equivalence technique specifies only the equivalent testing environment based on an accelerated testing duration. The required test duration shown in Table 2 for thermal cycle/shock tests may need a modification to accommodate the confidence requirement and sample size issues.

In general, the sample size, W, is related to (i) the reliability goal, R, (ii) the allowable number of failures in a test, K, and (iii) the confidence level, CL. The confidence level, CL, is the probability that the quantity K/W (the reliability estimate) is equal to the reliability goal, R. According to statistics theory, this probability follows the Binomial distribution:

$$CL = 1 - \sum_{x=0}^{K} \frac{W!}{x!(W-x)!}(1-R)^x R^{W-x} \quad (11)$$

Because the reliability goal of solder joints is usually high, in order to achieve a reasonable confidence level (80% to 90%), the sample size would be high. For example, if the reliability goal is R=99.9%, the confidence level CL=85%, and only one failure is allowed in an accelerated qualification test, the calculated sample size would be W=3155.

Thus, in most test specifications, no failure is allowed (K=0) and the required sample size can be determined by the following equation:

$$W = \frac{\log(1-CL)}{\log R(n)} \qquad (12)$$

where n is the required cycles in the qualification test, and R(n) is the reliability function, which is a decreasing function of operating cycles n. The reliability functions of Pb/Sn eutectic solder joints follow a modified Weibull distribution as follows:

$$R(n) = 0.5^{\left[\frac{n}{\eta}\right]^4} \qquad (13)$$

where η is the characteristic life. Once η is determined, the reliability function is obtained. Substituting Equation 13 into Equation 12 and through several iterations, it is possible to determine the test duration for specified sample sizes and confidence levels to validate a reliability goal.

While embodiments of the present invention have been illustrated and described, it is not intended that these embodiments illustrate and describe all possible forms of the present invention. Rather, the words used in the specification are words of description rather than limitation, and it is understood that various changes may be made without departing from the spirit and scope of the present invention.

What is claimed is:

1. A method for testing an electronic module to evaluate solder joint failures caused by thermally induced stress, the method comprising:

determining a thermal shock endurance test profile that represents field temperature conditions;

estimating time/cycles to failure of solder joints in the electronic module as a function of the field temperature conditions represented by the thermal shock endurance test profile using numerical simulation techniques;

selecting a design life target and a reliability target for the electronic module;

comparing the design life target of the electronic module with the estimated time/cycles to failure of at least one solder joint in the electronic module;

determining between robust, marginal, and non-robust electronic module designs based on the design life duration of the electronic module and the estimated time/cycles to failure of the at least one solder joint in the electronic module; and determining an accelerated thermal shock endurance test specification including temperature profile and test duration for testing a marginal electronic module design, wherein the accelerated thermal shock endurance test specification is determined as a function of the field temperature conditions represented by the thermal shock endurance test profile and the design life target and the reliability target of the electronic module.

2. The method of claim 1 wherein:

determining between robust, marginal, and non-robust electronic module designs includes applying a predetermined thermal shock endurance test time threshold that incorporates a design safety factor beyond a product minimum requirement.

3. The method of claim 1 further comprising:

advising the electronic module to be redesigned upon determining a non-robust electronic module design.

4. The method of claim 1 further comprising:

eliminating thermal shock endurance testing of the electronic module upon determining a robust electronic module design.

5. The method of claim 1 further comprising:

performing an accelerated thermal shock endurance test for testing the electronic module using the accelerated thermal shock endurance test specification for the test duration.

6. The method of claim 1 wherein:

determining a thermal shock endurance test profile that represents field temperature conditions includes selecting a standard test profile.

7. The method of claim 1 wherein:

determining a thermal shock endurance test profile that represents field temperature conditions includes determining a thermal shock endurance test profile based on field temperature measurements.

8. The method of claim 1 wherein:

estimating time/cycles to failure of solder joints in the electronic module includes estimating time/cycles to failure of solder joints in the electronic module based on plastic strain range using numerical simulation techniques.

9. The method of claim 1 wherein:

estimating time/cycles to failure of solder joints in the electronic module includes estimating time/cycles to failure of solder joints in the electronic module based on energy density calculated from stress-strain hysteresis loop using numerical simulation techniques.

10. The method of claim 1 further comprising:

identifying the electronic components with weak solder joints upon determining a non-robust electronic module design.

11. The method of claim 1 wherein:

the numerical simulation technique includes finite element analysis.

12. The method of claim 1 wherein:

the at least one solder joint is the weakest solder joint.

* * * * *